(12) United States Patent
Lu et al.

(10) Patent No.: US 12,249,663 B2
(45) Date of Patent: Mar. 11, 2025

(54) THIN FILM TRANSISTOR BASED LIGHT SENSOR

(71) Applicant: Taiwan Semiconductor Manufacturing Co., Ltd., Hsinchu (TW)

(72) Inventors: Shih-Llen Linus Lu, Hsinchu (TW); Katherine H. Chiang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 658 days.

(21) Appl. No.: 17/461,211

(22) Filed: Aug. 30, 2021

(65) Prior Publication Data

US 2023/0063673 A1 Mar. 2, 2023

(51) Int. Cl.
| | |
|---|---|
| *G08B 13/189* | (2006.01) |
| *H01L 31/02* | (2006.01) |
| *H01L 31/0203* | (2014.01) |
| *H01L 31/0272* | (2006.01) |
| *H01L 31/101* | (2006.01) |

(52) U.S. Cl.
CPC .... *H01L 31/02019* (2013.01); *G08B 13/1895* (2013.01); *H01L 31/0203* (2013.01); *H01L 31/0272* (2013.01); *H01L 31/101* (2013.01)

(58) Field of Classification Search
CPC . G08B 13/1895; H01L 27/1225; H01L 27/14; H01L 27/144; H01L 27/1251; H01L 31/1136; H01L 23/576; H01L 2924/13072
See application file for complete search history.

(56) References Cited

U.S. PATENT DOCUMENTS

| | | | | |
|---|---|---|---|---|
| 2010/0321227 | A1* | 12/2010 | Hales | H03M 1/146 341/158 |
| 2014/0314173 | A1* | 10/2014 | Hekmat | H04L 25/06 330/261 |
| 2020/0006412 | A1* | 1/2020 | Li | H01L 27/127 |

OTHER PUBLICATIONS

Po Tsun Liu , Highly Responsive Blue Light Sensor with Amorphous Indium-Zinc-Oxide Thin-Film Transistor based Architecture, May 25, 2018, Sci Rep 8, 8153, pp. 1-12 (Year: 2018).*

* cited by examiner

*Primary Examiner* — Amar Movva
*Assistant Examiner* — Sandra Milena Rodriguez Villan
(74) *Attorney, Agent, or Firm* — Sterne, Kessler, Goldstein & Fox. P.L.L.C.

(57) ABSTRACT

The present disclosure describes an embodiment of a thin film transistor based light sensor circuit. The thin film transistor based light sensor circuit includes two thin film transistors, in which a channel region of one of the thin film transistors includes a light sensing area and a channel region of the other thin film transistor has a capping material disposed thereon. The thin film transistor based light sensor circuit further includes a comparator device electrically coupled to the two thin film transistors and configured to detect a current difference between the thin film transistors in response to the thin film transistor with the channel region having the light sensing area being exposed to light.

20 Claims, 13 Drawing Sheets

THIN FILM TRANSISTOR BASED LIGHT SENSOR

BACKGROUND

Integrated circuit devices can be susceptible to physical intrusion to, for example, access sensitive information stored in the devices or to reverse engineer the design of the integrated circuit devices. For example, upon an unauthorized access to an integrated circuit device (such as by removing a top cover of an integrated circuit chip package or a device casing), the integrated circuit device can be probed at a point of interest to access sensitive information. Additionally, to reverse engineer the design of the integrated circuit device, photographs can be taken of different integrated circuit device layers. Such physical intrusion of the integrated circuit device compromises a user's sensitive information and a manufacturer's proprietary integrated circuit design.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

Illustrative embodiments of the present disclosure will now be described with reference to the accompanying drawings. In the drawings, like reference numerals generally indicate identical, functionally similar, and/or structurally similar elements.

DETAILED DESCRIPTION

Figure 1:
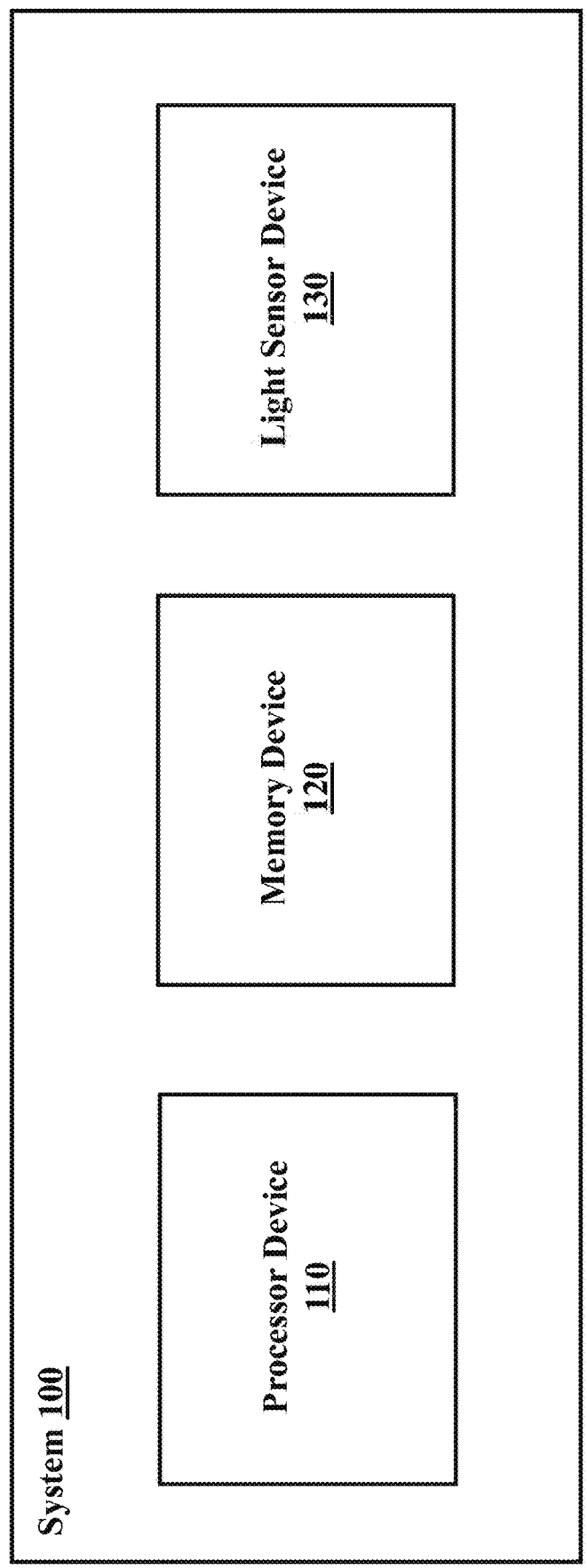
FIG. 1 is an illustration of a system with a light sensor device, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments of the present disclosure and/or configurations discussed.

In some embodiments of the present disclosure, the terms "substantially" and "about" can indicate a value of a given quantity that varies within 5% of the value (e.g., ±1%, ±2%, ±3%, ±4%, ±5% of the value). These values are merely examples and are not intended to be limiting. The terms "substantially" and "about" can refer to a percentage of the values as interpreted by those skilled in relevant art in light of the disclosure herein.

The following disclosure describes aspects of a thin film transistor based light sensor circuit. In some embodiments of the present disclosure, the thin film transistor based light sensor circuit includes two thin film transistors—one thin film transistor with a channel region having a light sensing area and another thin film transistor with a channel region having a capping material disposed thereon—and a comparator device. The comparator device can include two inputs: one input that is electrically coupled to a source/drain terminal of the thin film transistor with the channel region having the light sensing area and another input that is electrically coupled to a source/drain terminal of the thin film transistor with the channel region having the capping material disposed thereon. Based on a detection of light, the thin film transistor with the channel region having the light sensing area generates a current greater than that of the thin film transistor with the channel region having the capping material disposed thereon. As a result, an output of the comparator device can transition from a logic low value to a logic high value, or vice versa, indicating the detection of light by the thin film transistor based light sensor circuit. The output of the comparator device can be used to trigger an alarm or alert of a potential unauthorized access to an integrated circuit device. Benefits of the thin film transistor based light sensor circuit, among others, include low power consumption, a compact circuit design, and independence from temperature variations.

FIG. 1 is an illustration of a system 100 with a light sensor device 130, according to some embodiments of the present disclosure. In addition to light sensor device 130, system 100 includes a processor device 110 and a memory device 120. Though system 100 includes processor device 110, memory device 120, and light sensor device 130, based on the description herein, system 100 can include other elements-such as an input/output circuit, an interconnect bus controller, and other analog/digital circuits-which are within the spirit and scope of the present disclosure.

In some embodiments of the present disclosure, processor device 110 can be a central processing unit, a graphics processing unit, or a combination thereof. Processor device 110 can be other types of processing devices, such as a network processing device, a sound processing device, and an application-specific integrated circuit. These other types of processing devices are within the spirit and scope of the present disclosure. In some embodiments of the present disclosure, memory device 120 can be any type of memory, such as a static random access memory device, a dynamic random access memory device, a synchronous dynamic random access memory device, a flash memory device, a magneto-resistive random access memory device, a phase-change random access memory device, and a ferroelectric random access memory device. Processor device 110 can perform one or more functions in system 100, such as execution of a program and application. Memory device 120 can be used to store the program and application, as well as store data used by the program and application to be accessed by processor device 110.

Light sensor device 130 is configured to detect light in system 100, according to some embodiments of the present disclosure. For example, system 100 can be included in an integrated circuit chip package or a device casing. If a top cover of the integrated circuit chip package or the device casing is removed-thus exposing system 100 to light-light sensor device 130 can detect that the top cover has been removed. Based on the description herein, system 100 can be enclosed in other types of packages or enclosures, which are within the spirit and scope of the present disclosure.

Light sensor device 130 can be a separate element from processor device 110 and memory device 120 as shown in FIG. 1, according to some embodiments of the present disclosure. In some embodiments of the present disclosure, light sensor device 130 can be integrated into processor device 110, memory device 120, or any other element not shown in system 100 (e.g., an input/output circuit, an interconnect bus controller, and other analog/digital circuits).

Figure 2:
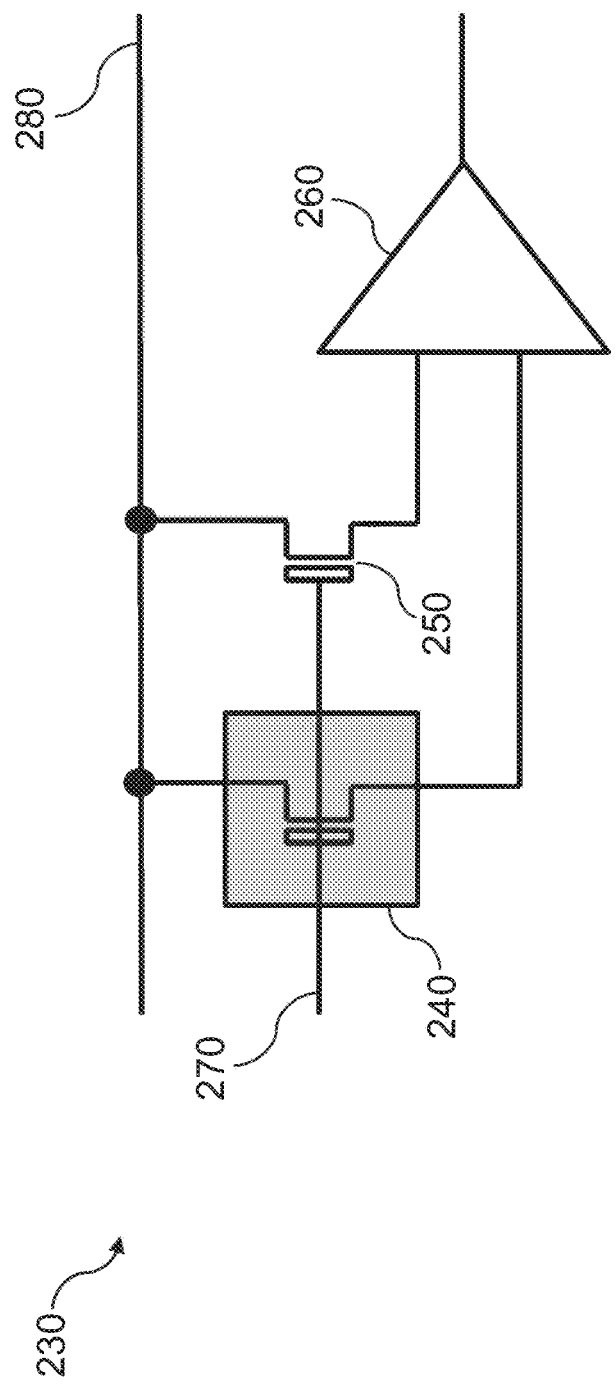
FIG. 2 is an illustration of a thin film transistor based light sensor circuit that can be implemented in a light sensor device, according to some embodiments of the present disclosure.

FIG. 2 is an illustration of a thin film transistor based light sensor circuit 230 that can be implemented in light sensor device 130 of FIG. 1, according to some embodiments of the present disclosure. Thin film transistor based light sensor circuit 230 includes a thin film transistor 240, a thin film transistor 250, and a comparator device 260.

Thin film transistor 240 includes a gate region, a channel region, a first source/drain region, and a second source/drain region. The gate region can be electrically coupled, via a gate terminal, to a voltage source 270. In some embodiments of the present disclosure, voltage source 270 can be ground (e.g., 0 V) or a negative voltage (e.g., −0.5 V, −1.0 V, −1.5 V, −2.0 V, −2.5 V, −3.0 V, or any suitable negative voltage). The first source/drain region of thin film transistor 240 can be electrically coupled, via a first source/drain terminal, to a voltage source 280. In some embodiments of the present disclosure, voltage source 280 can be a power supply voltage source (e.g., 0.4 V, 0.6 V, 0.7 V, 1.0 V, 1.2 V, 1.8 V, 2.4 V, 3.3 V, and 5.0 V) or other positive voltage source (e.g., 5 V, 10 V, and 15 V). The second source/drain region of thin film transistor 240 can be electrically coupled, via a second source/drain terminal, to an input of comparator device 260. The channel region of thin film transistor 240 includes a portion that is covered by a capping material to block (or prevent) the portion of the channel region from receiving light, according to some embodiments of the present disclosure. In some embodiments of the present disclosure, the capping material can be selenium, selenium oxide, or any other suitable material to block (or prevent) the channel region from receiving light. For illustration purposes, the circuit symbol for thin film transistor 240 in FIG. 2 is encompassed by a gray shaded box to indicate that the capping material covers a portion of thin film transistor 240's channel region.

Thin film transistor 250 includes a gate region, a channel region, a first source/drain region, and a second source/drain region. The gate region can be electrically coupled, via a gate terminal, to voltage source 270. The first source/drain region of thin film transistor 250 can be electrically coupled, via a first source/drain terminal, to voltage source 280. The second source/drain region of thin film transistor 250 can be electrically coupled, via a second source/drain terminal, to another input of comparator device 260. The channel region of thin film transistor 250 includes a light sensing area, according to some embodiments of the present disclosure.

Comparator device 260 is configured to receive voltage inputs from the second source/drain terminals of thin film transistors 240 and 250, according to some embodiments of the present disclosure. The voltages at the second source/drain terminals of thin film transistors 240 and 250 are generated based on currents flowing through thin film transistors 240 and 250. For example, with the gate terminals of thin film transistors 240 and 250 electrically coupled to voltage source 270 (e.g., ground or a negative voltage source), the first source/drain terminals of thin film transistors 240 and 250 electrically coupled to voltage source 280 (e.g., a positive voltage source), and no light detected by the light sensing area of thin film transistor 250, thin film transistors 240 and 250 conduct substantially the same current and generate substantially the same voltages at the inputs of comparator device 260.

When light is detected by the light sensing area of thin film transistor 250 (e.g., a top cover of an integrated circuit chip package or a device casing is removed, thus exposing thin film transistor based light sensor circuit 230 to light), thin film transistor 250 conducts a greater current than that of thin film transistor 240 and generates a higher voltage input to comparator device 260 than that of thin film transistor 240 (which has a channel region that is covered by a capping material and thus not exposed to the light). Due to the voltage differential at the inputs of comparator device 260, an output of comparator device 260 transitions from a logic low value to a logic high value, or vice versa, indicating the detection of light by thin film transistor based light sensor circuit 230. In some embodiments of the present disclosure, upon detection of light, the transition of output of comparator device 260 can be processed (e.g., by processor device 110 of FIG. 1) to trigger an alert or alarm of a potential unauthorized access to an integrated circuit device (e.g., that incorporates system 100 of FIG. 1).

Figure 3:
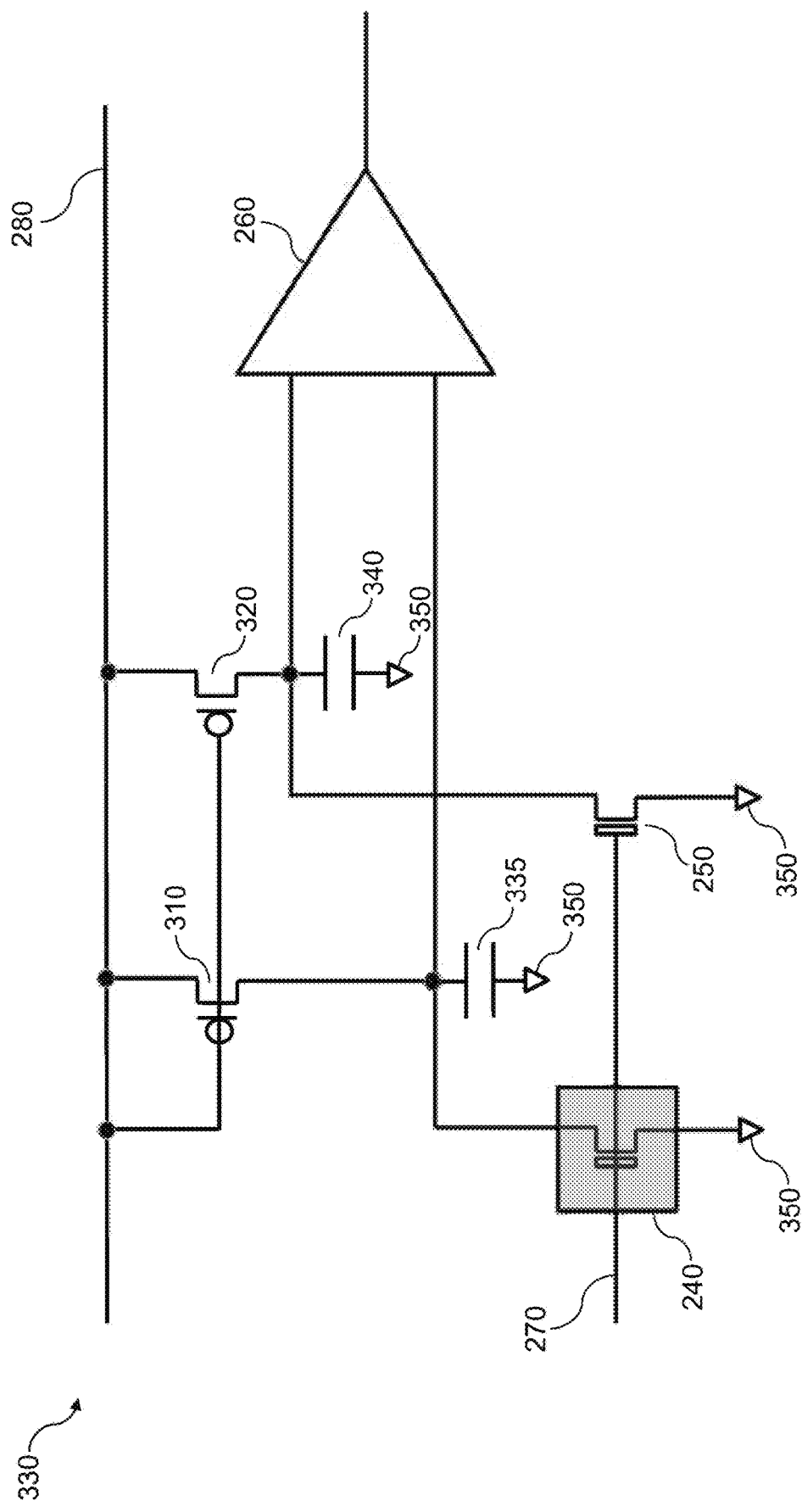
FIG. 3 is an illustration of another thin film transistor based light sensor circuit that can be implemented in a light sensor device, according to some embodiments of the present disclosure.

FIG. 3 is an illustration of another thin film transistor based light sensor circuit 330 that can be implemented in light sensor device 130 of FIG. 1, according to some embodiments of the present disclosure. Thin film transistor based light sensor circuit 330 includes thin film transistors 240 and 250, comparator device 260, p-channel transistors 310 and 320, and capacitors 335 and 340. P-channel transistors 310 and 320 can be p-channel complementary metal oxide semiconductor field effect transistors, according to some embodiments of the present disclosure. Further, in some embodiments of the present disclosure, p-channel transistors 310 and 320 can have substantially similar physical dimensions, such that, when the same voltages are applied to the gate and source/drain terminals of p-channel transistors 310 and 320, p-channel transistors 310 and 320 have substantially the same electrical characteristics (e.g., current, resistance, and other electrical characteristics). In some embodiments of the present disclosure, capacitors 335 and 340 have substantially the same capacitance values.

Each of p-channel transistors 310 and 320 can include a gate region, a first source/drain region, and a second source/drain region. The gate regions and first source/drain regions of p-channel transistors 310 and 320 can be electrically coupled, via respective gate terminals and first source/drain terminals, to voltage source 280. The second source/drain regions of p-channel transistors 310 and 320 are electrically coupled, via second source/drain terminals, to first terminals of capacitors 335 and 340. Second terminals of capacitors 335 and 340 are electrically coupled to a voltage source 350. In some embodiments of the present disclosure, voltage source 350 can be ground or 0 V.

The gate regions of thin film transistors 240 and 250 can be electrically coupled, via gate terminals of thin film transistors 240 and 250, to voltage source 270. The channel region of thin film transistor 240 includes a portion that is covered by a capping material to block (or prevent) the portion of the channel region from receiving light, according to some embodiments of the present disclosure. For illustration purposes, thin film transistor 240 is shown with gray rectangle to indicate that its channel region includes a portion covered by a capping material. In some embodiments of the present disclosure, the capping material can be selenium, selenium oxide, or any other suitable material to block (or prevent) the channel region from receiving light. The channel region of thin film transistor 250 includes a light sensing area, according to some embodiments of the present disclosure.

The first source/drain region of thin film transistor 240 can be electrically coupled, via the first source/drain terminal of thin film transistor 240, to the first terminal of capacitor 335 and to the second source/drain terminal of p-channel transistor 310. Similarly, the first source/drain region of thin film transistor 250 can be electrically coupled, via the first source/drain terminal of thin film transistor 250, to the first terminal of capacitor 340 and to the second source/drain terminal of p-channel transistor 320. The second source/drain regions of thin film transistors 240 and 250 can be electrically coupled, via the second source/drain terminals of thin film transistors 240 and 250, to voltage source 350, according to some embodiments of the present disclosure.

Comparator device 260 is configured to receive voltage inputs corresponding to charge stored in capacitors 335 and 340, according to some embodiments of the present disclosure. The charge stored in capacitors 335 and 340 correspond to a voltage drop across p-channel transistors 310 and 320, respectively. For example, with the gate terminals of thin film transistors 240 and 250 electrically coupled to voltage source 270 (e.g., ground or a negative voltage source), the second source/drain terminals of thin film transistors 240 and 250 electrically coupled to voltage source 350 (e.g., ground or 0 V), and no light detected by the light sensing area of thin film transistor 250, thin film transistors 240 and 250 conduct substantially the same current. With p-channel transistors 310 and 320 having substantially similar dimensions and thus substantially similar electrical characteristics, p-channel transistors 310 and 320 have substantially similar voltage drops to each other when thin film transistors 240 and 250 conduct substantially the same current. In turn, when no light is detected and with capacitors 335 and 340 having substantially the same capacitance values, capacitors 335 and 340 store substantially the same charge. Thus, substantially the same voltages are generated at the inputs of comparator device 260.

When light is detected by the light sensing area of thin film transistor 250 (e.g., a top cover of an integrated circuit chip package or a device casing is removed, thus exposing thin film transistor based light sensor circuit 330 to light), thin film transistor 250 conducts a greater current than that of thin film transistor 240 (which has a channel region that is covered by a capping material and thus not exposed to the light). The current generated by thin film transistor 250 discharges capacitor 340, thus causing a difference between charge stored in capacitors 335 and 340. Further, due to the current and charge differentials, the voltage drops across p-channel transistors 310 and 320 become different. In turn, comparator device 260 has a voltage differential across its inputs, thus causing its output to transition from a logic low value to a logic high value, or vice versa, indicating the detection of light by thin film transistor based light sensor circuit 330. In some embodiments of the present disclosure, upon detection of light, the transition of output of comparator device 260 can be processed (e.g., by processor device 110 of FIG. 1) to trigger an alert or alarm of a potential unauthorized access to an integrated circuit device (e.g., that incorporates system 100 of FIG. 1).

Figure 4:
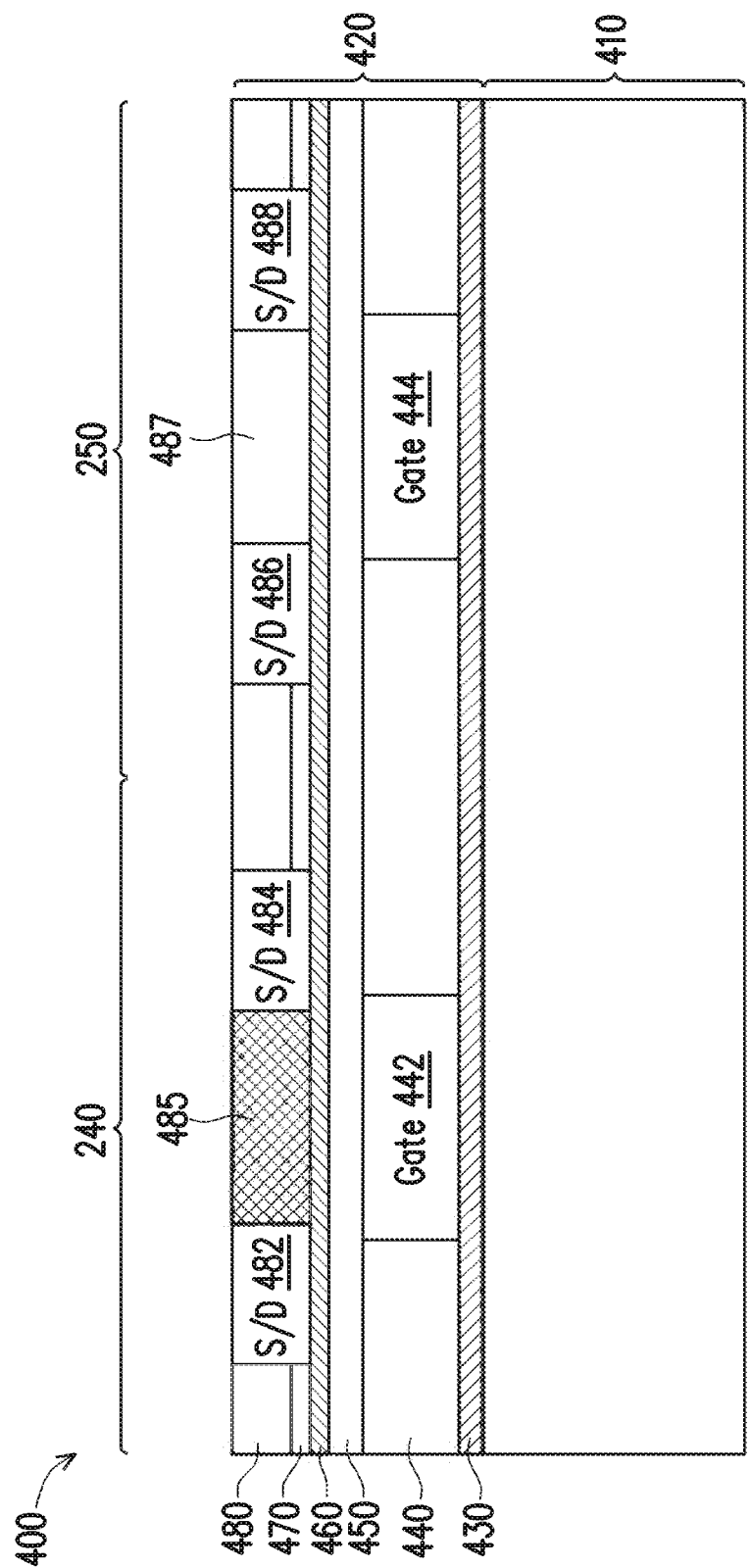
FIG. 4 is an illustration of an integrated circuit structure with a device layer and a thin film transistor device structure, according to some embodiments of the present disclosure.

FIG. 4 is an illustration of an integrated circuit structure 400 with a device layer 410 and a thin film transistor device layer 420, according to some embodiments of the present disclosure. Integrated circuit structure 400 can be implemented in system 100 of FIG. 1, such as in light sensor device 130. Integrated circuit structure 400 can include circuit structures, such as thin film transistor based light sensor circuit 230 of FIG. 2 and thin film transistor based light sensor circuit 330 of FIG. 3. In some embodiments of the present disclosure, thin film transistors 240 and 250 can be formed in thin film transistor device layer 420 of FIG. 4 and the remaining circuit elements—e.g., comparator device 260, p-channel transistors 310 and 320, and capacitors 335 and 340—can be formed in device layer 410 of FIG. 4.

Device layer 410 can include a front end of line portion, a middle end of line portion, and a back front end of line portion—not shown in FIG. 4 for simplicity purposes. The front end of line portion can include structures fabricated on a substrate (e.g., active devices, passive devices, source/drain contact structures, gate contact structures, etc.) during a front end of line stage of integrated circuit fabrication. In some embodiments, the structures can include comparator device 260, p-channel transistors 310 and 320, and capacitors 335 and 340.

The middle end of line portion can include low-level interconnect structures (e.g., one or two layers of contacts and/or metal lines) fabricated on the front end of line portion during a middle end of line stage of integrated circuit fabrication. The low-level interconnect structures can electrically couple device terminals (e.g., source/drain contact structures, gate contact structures, etc.) to one another and/or to higher level interconnects in the back end of line portion. For example, referring to FIG. 2, the lower-interconnect structures can electrically couple (i) the gate terminals of thin film transistors 240 and 250 to voltage source 270, (ii) the first source/drain terminals of thin film transistors 240 and 250 to voltage source 280, and (iii) the second source/drain terminals of thin film transistor 240 and 250 to comparator device 260. Referring to FIG. 3, the lower-interconnect structures can electrically couple (i) the gate terminals and first source/drain terminals of p-channel transistors 310 and 320 to voltage source 280, (ii) the second source/drain terminals of p-channel transistors 310 and 320 to the first terminals of capacitors 335 and 340, respectively, (iii) the second terminals of capacitors 335 and 240 to voltage source 350, (iv) the gate terminals of thin film transistors 240 and 250 to voltage source 270, (v) the first source/drain terminals of thin film transistors 240 and 250 to the respective second source/drain terminals of p-channel transistors 310 and 320, the respective first terminals of capacitors 335 and 340, and to comparator device 360, and (vi) the second source/drain terminals of thin film transistors 240 and 250 to voltage source 350.

The back end of line portion can include high-level interconnect structures (e.g., metal lines, vias, etc.) fabricated on the middle end of line portion during a back end of line stage of integrated circuit fabrication. For example, the high-level interconnect structures can electrically couple devices formed in thin film transistor device layer 420 to devices in the front end of line portion of device layer 410, such as comparator device 260, p-channel transistors 310 and 320, and capacitors 335 and 340.

In some embodiments of the present disclosure, thin film transistors 240 and 250 can be formed in thin film transistor device layer 420. Thin film transistor device layer 420 includes a first oxide layer 430, a second oxide layer 440, a gate oxide layer 450, a channel layer 460, a third oxide layer 470, and a fourth oxide layer 480, according to some embodiments of the present disclosure. Channel layer 460 can include an indium-gallium-zinc-oxide semiconductor material, an indium-tungsten-zinc-oxide semiconductor material, or any other suitable material, according to some embodiments of the present disclosure.

In some embodiments of the present disclosure, gate region 442 of thin film transistor 240 can be embedded in second oxide layer 440. Source/drain regions 482 and 484 of thin film transistor 240 can be embedded in third oxide layer 470 and fourth oxide layer 480. Also, over a portion of channel layer 460, a capping material 485 can be disposed between source/drain regions 482 and 484. Capping material 485 can be selenium, selenium oxide, or any other suitable material to block (or prevent) the channel region of thin film transistor 240 from receiving light, according to some embodiments of the present disclosure.

In some embodiments of the present disclosure, gate region 444 of thin film transistor 250 can be embedded in second oxide layer 440. Source/drain regions 486 and 488 of thin film transistor 250 can be embedded in third oxide layer 470 and fourth oxide layer 480. Also, over a portion of channel layer 460, a light sensing area 487 (e.g., an opening 487) can be formed between source/drain regions 486 and 488, according to some embodiments of the present disclosure.

In some embodiments of the present disclosure, thin film transistor device layer 420 includes interconnect structures to electrically couple thin film transistors 240 and 250 to underlying devices—e.g., comparator device 260, p-channel transistors 310 and 320, and capacitors 335 and 340—and/or interconnect structures in device layer 410. Further, in some embodiments of the present disclosure, additional interconnect structures can be disposed on thin film transistor device layer 420 (not shown in FIG. 4). The additional interconnect structures can electrically couple underlying devices and/or interconnect structures to one another. The additional interconnect structures can also electrically couple underlying devices and/or interconnect structures to circuit elements external to integrated circuit structure 400, such as to circuit elements in other integrated circuit structures.

In some embodiments of the present disclosure, the additional interconnect structures disposed on thin film transistor device layer 420 (not shown in FIG. 4) can be used to cover the middle portion of the channel region of thin film transistor 240 in place of capping material 485 (e.g., capping material 485 is not disposed over the middle portion of the channel region of thin film transistor 240). Further, in some embodiments of the present disclosure, the additional interconnect structures can have an opening above light sensing area 487 so that thin film transistor 250 can be exposed to light (e.g., when a top cover of an integrated circuit chip package or a device casing is removed).

Benefits of integrated circuit structure 400, among others, include a compact circuit design, low power consumption, and independence from temperature variations. With regard to compact circuit design, as described above with respect to FIG. 4, thin film transistor based light sensor circuit 230 of FIG. 2 and thin film transistor based light sensor circuit 330 of FIG. 3 can be fabricated over other devices (e.g., devices in device layer 410). As a result, the die size footprint of thin film transistor based light sensor circuit 230 and thin film transistor based light sensor circuit 330 is minimal.

With regard to the low power consumption, a light sensor circuit in integrated circuit structure 400 (e.g., thin film transistor based light sensor circuit 230 of FIG. 2 and thin film transistor based light sensor circuit 330 of FIG. 3) can be biased such that the thin film transistors in the light sensor circuit are in an "off" state and conduct very little current when they are not exposed to light. And when the light sensor circuit is exposed to light, the current conducted by the thin film transistor with a light sensing area (e.g., thin film transistor 250 of FIGS. 2 and 3) is slightly higher than that when the thin film transistor is not exposed to light, thus the light sensor circuit consumes very little power.

For example, referring to FIGS. 2 and 3, voltage source 270 can be ground (e.g., 0 V) or a negative voltage (e.g., −0.5 V, −1.0 V, −1.5 V, −2.0 V, −2.5 V, −3.0 V, or any suitable negative voltage) and voltage source 280 can be a power supply voltage source (e.g., 0.4 V, 0.6 V, 0.7 V, 1.0 V, 1.2 V, 1.8 V, 2.4 V, 3.3 V, and 5.0 V) or other positive voltage source (e.g., 5 V, 10 V, and 15 V), such that thin film transistors 240 and 250 are in an "off" state-conducting very little current (e.g., about $1\times10^{-11}$ A or less—a sub-threshold current)—when thin film transistor light sensing circuits 230 and 330 are not exposed to light. And, when thin film transistor based light sensing circuits 230 and 330 are exposed to light (e.g., a top cover of an integrated circuit chip package or a device casing is removed, thus exposing thin film transistor based light sensor circuits 230 and 330 to light), thin film transistor 240 remains in the "off" state and conduct very little current (e.g., about $1\times10^{-11}$ A or less—a sub-threshold current), while thin film transistor 250 also remains in the "off" state and conducts current slightly higher than that of thin film transistors 240 (e.g., about $1\times10^{-9}$ A—another sub-threshold current) to cause a voltage differential at the inputs of comparator device 260. Due to the voltage differential at the inputs of comparator device 260, an output of comparator device 260 transitions from a logic low value to a logic high value, or vice versa, indicating the detection of light by thin film transistor based light sensor circuits 230 and 330. Since thin film transistors 240 and 250 remain in the "off" state—conducting very little current—when exposed to light, thin film transistor based light sensor circuits 230 and 330 have low power consumption.

Figure 5:
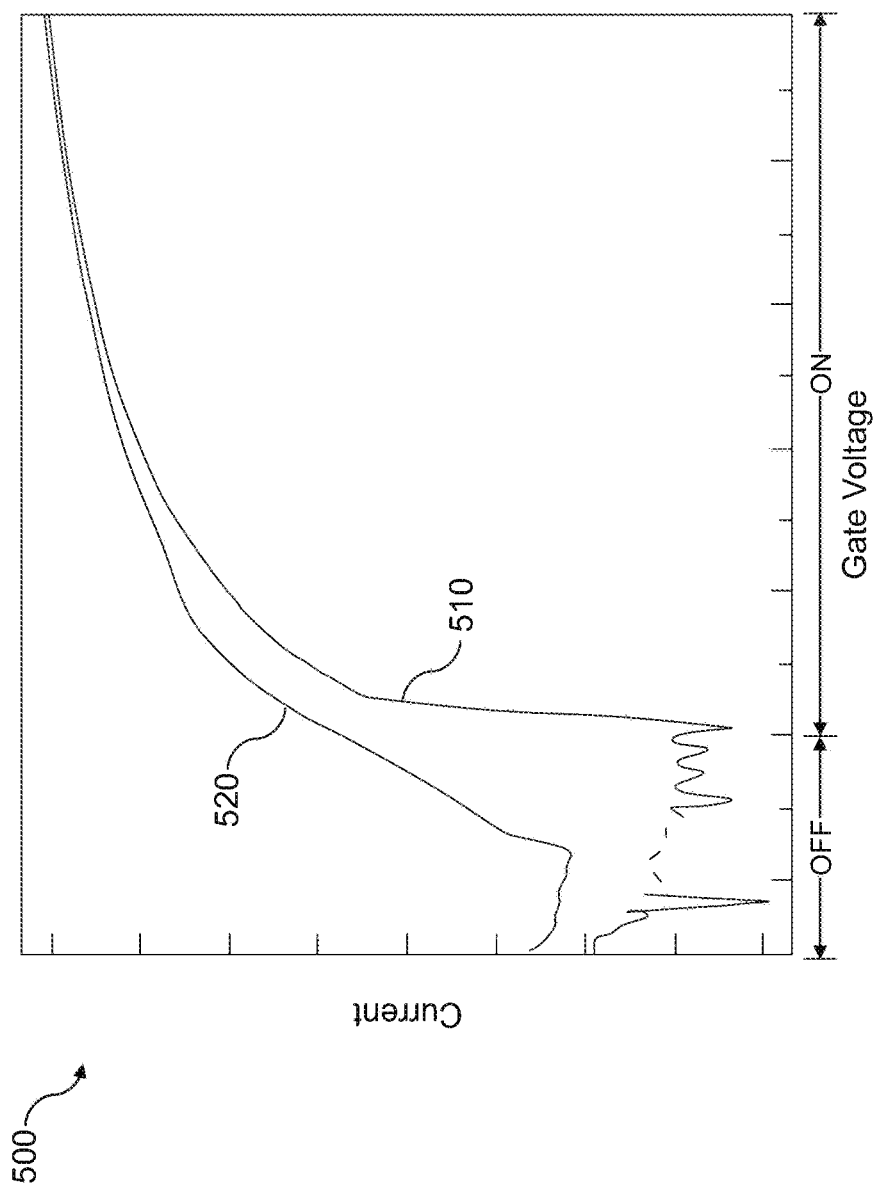
FIG. 5 is an illustration of an example graph showing a relationship between drain current of a thin film transistor and gate voltage of the thin film transistor, according to some embodiments of the present disclosure.

FIG. 5 is an illustration of an example graph 500 showing a relationship between drain current of a thin film transistor and gate voltage of the thin film transistor, according to some embodiments of the present disclosure. In some embodiments of the present disclosure, this relationship between drain current and gate voltage applies to thin film transistors 240 and 250 of FIGS. 2 and 3. Referring to FIG. 5, biased at a gate voltage that sets the thin film transistor in an "off" state, the thin film transistor conducts very little current (e.g., about $1\times10^{-11}$ A or less—a sub-threshold current) when it is not exposed to light, as shown by waveform 510. And, when the thin film transistor is exposed to light and biased at the gate voltage that sets the thin film transistor in the "off" state, the thin film transistor conducts a higher current (e.g., about $1\times10^{-9}$ A—another sub-threshold current) but less current than compared if the gate voltage of the thin film transistor is in the "on" state, as shown by waveform 520.

With regard to independence from temperature variations, the relationship between drain current of the thin film transistor and gate voltage of the thin film transistor is relatively constant across temperature. For example, referring to FIG. 5, waveforms 510 and 520 for the thin film transistors when they are not exposed to light and when they are exposed to light are very similar across temperature (e.g., across a temperature range from about 30° C. to about 120° C.).

Figure 6:
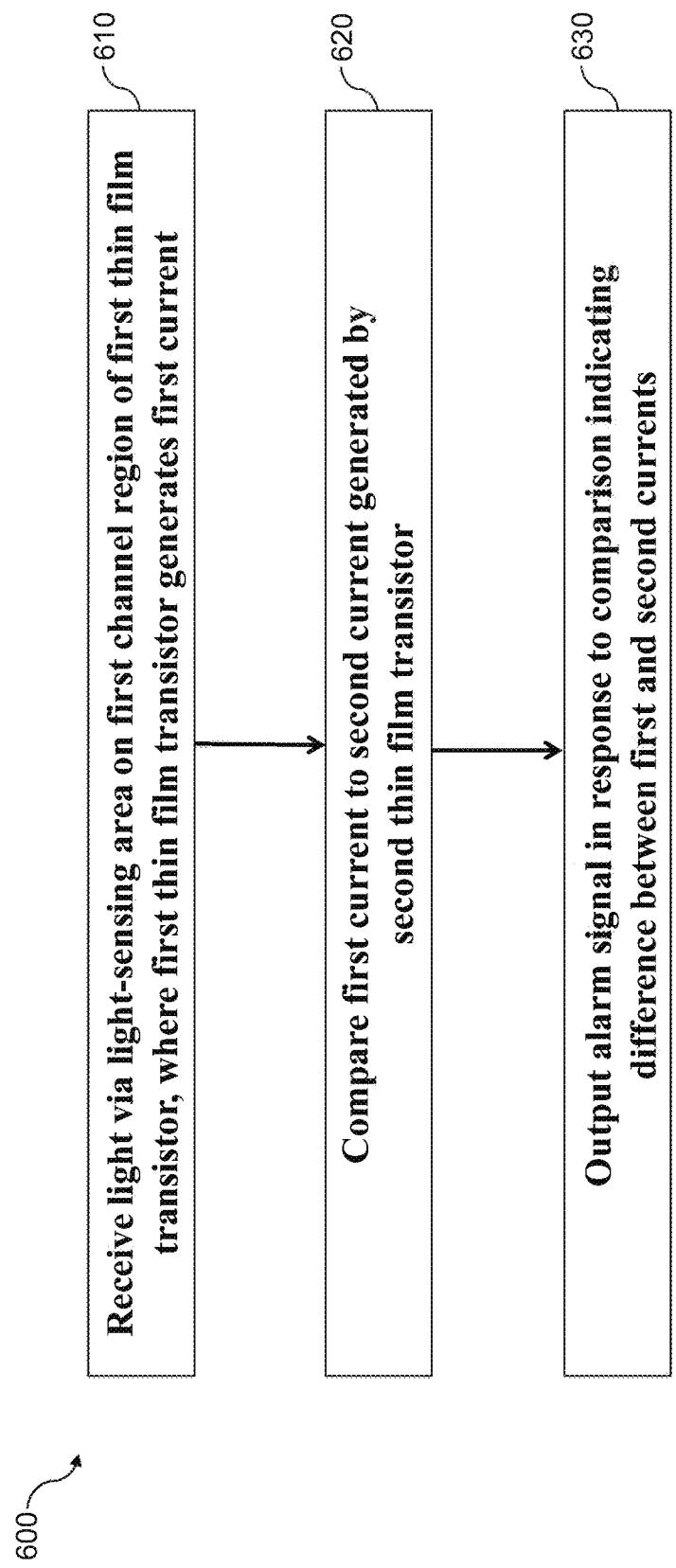
FIG. 6 is an illustration of a method for detecting light using a thin film transistor based light sensor circuit, according to some embodiments of the present disclosure.

FIG. 6 is an illustration of a method 600 for detecting light using a thin film transistor based light sensor circuit, according to some embodiments of the present disclosure. For example purposes, thin film transistor based light sensor circuit 230 of FIG. 2, thin film based light sensor circuit 330 of FIG. 3, and integrated circuit structure 400 of FIG. 4 are used to facilitate in the description of method 600. Thin film transistor light sensor circuits 230 and 330 can each be implemented in a light sensor device as part of a system—e.g., light sensor device 130 of system 100 of FIG. 1—in which the system is enclosed such that the light sensor device and other elements of the system are surrounded by an integrated circuit package with a top cover or a device casing with a top cover. Based on the description herein, the system can be enclosed in other types of packages and/or casings, which are within the scope and spirit of the present disclosure.

In operation 610, light is received via a light sensing area on a first channel region of a first thin film transistor. The first thin film transistor is configured to generate a first current based on the received light. Referring to FIGS. 2 and 3, the first thin film transistor can be thin film transistor 250, which includes a channel region with a light sensing area configured to detect light. For example, referring to FIG. 4, thin film transistor 250 can include source/drain regions 486 and 488 with light sensing area 487 (e.g., opening 487) there between, in which light sensing area 487 is over a portion of channel layer 460.

In operation 620 of FIG. 6, the first current generated by the first thin film transistor is compared to a second current generated by a second thin film transistor. The second film transistor includes a second channel region with a capping material disposed thereon to prevent the second thin film transistor from receiving the light. Referring the FIGS. 2 and 3, the second film transistor can be thin film transistor 240, which includes a channel region with a middle portion covered by a capping material. For example, referring to FIG. 4, thin film transistor 240 can include source/drain regions 482 and 484 with capping material 485 there between, in which capping material 485 is over a portion of channel layer 460 (e.g., a middle portion of the channel region of thin film transistor 240). Capping material 485 can block (or prevent) the channel region of thin film transistor 240 from receiving light In some embodiments of the present disclosure, with regard to the first current and second current generated by the first thin film transistor and second thin film transistor, respectively (e.g., thin film transistor 250 and thin film transistor 240, respectively), the first and second thin film transistors can be biased in an "off" state such that the thin film transistors generate very little current when they are not exposed to light. For example, referring to FIG. 5, the first and second thin film transistors can be biased at a gate voltage that sets the thin film transistors in an "off" state, in which the first and second thin film transistors conduct very little current (e.g., about $1\times10^{-11}$ A or less—a sub-threshold current) when they are not exposed to light, as shown by waveform 510.

In response to the first and second thin film transistors being exposed to light (e.g., a top cover of an integrated circuit chip package or a device casing is removed, thus exposing thin film transistor based light sensor circuits 230 and 330 to light), the second thin film transistor remains in the "off" state and conduct the substantially the same current as it was conducting when not exposed to light (e.g., about $1\times10^{-11}$ A or less—a sub-threshold current), while the first thin film transistor also remains in the "off" state current but conducts a slightly higher current than the second thin film transistor (e.g., about $1\times10^{-9}$ A—another sub-threshold current).

Referring to FIGS. 2 and 3, comparator device 260 is configured to compare the first current of the first thin film transistor to the second current of the second thin film transistor. Referring to FIG. 3, when thin film transistor 240 and thin film transistor 250 (e.g., the second thin film transistor and first thin film transistor, respectively) are not exposed to light, capacitor 335 and capacitor 340 are charged to substantially the same level, which corresponds to a voltage drop across p-channel transistors 310 and 320, respectively. In response to receiving light via the light sensing area of thin film transistor 250, thin film transistor 250 discharges capacitor 340, thus causing difference between charge stored in capacitors 335 and 340.

In operation 630 of FIG. 6, an alarm signal is outputted in response to the comparison (from operation 620) indicating a difference between the first current of the first thin film and the second current of the second thin film transistor. Referring to FIGS. 2 and 3, due to the difference in currents generated by thin film transistors 240 and 250 when exposed to light and the resulting voltage differential at the inputs of comparator device 260, an output of comparator device 260 transitions from a logic low value to a logic high value, or vice versa, indicating the detection of light by thin film transistor based light sensor circuits 230 and 330. In some embodiments of the present disclosure, upon detection of light, the transition of output of comparator device 260 can be processed (e.g., by processor device 110 of FIG. 1) to trigger an alert or alarm of a potential unauthorized access to an integrated circuit device (e.g., that incorporates system 100 of FIG. 1).

Figure 7:
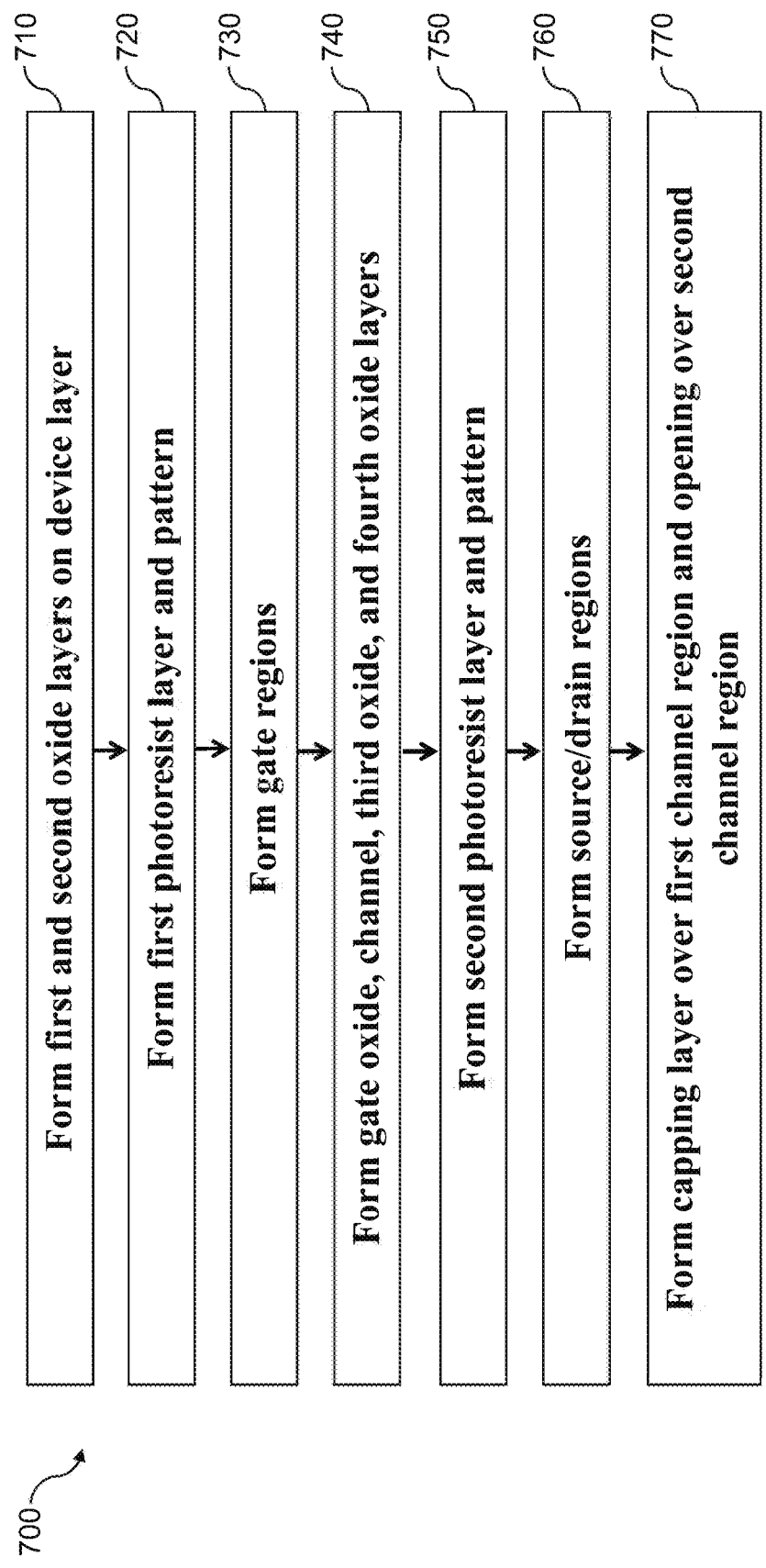
FIG. 7 is an illustration of a method for fabricating a thin film transistor device structure on a device layer, according to some embodiments of the present disclosure.

FIG. 7 is an illustration of a method 700 for fabricating a thin film transistor device structure on a device layer, according to some embodiments of the present disclosure. For illustration purposes, method 700 will be described with reference to FIGS. 4 and 8-13, which shows the thin film transistor device structure on the device layer at various stages of the thin film transistor device structure's fabrication process, according to some embodiments of the present disclosure. The operations of method 700 can be performed in a different order or some of the operations may not be performed depending on specific applications. It should be noted that method 700 may not produce a complete integrated circuit structure. Accordingly, it is understood that additional operations can be provided before, during, or after method 700, and that some other operations may only be briefly described herein. Elements in FIGS. 8-13 with the same annotations as the elements in the previous figures are described above.

Figure 8:
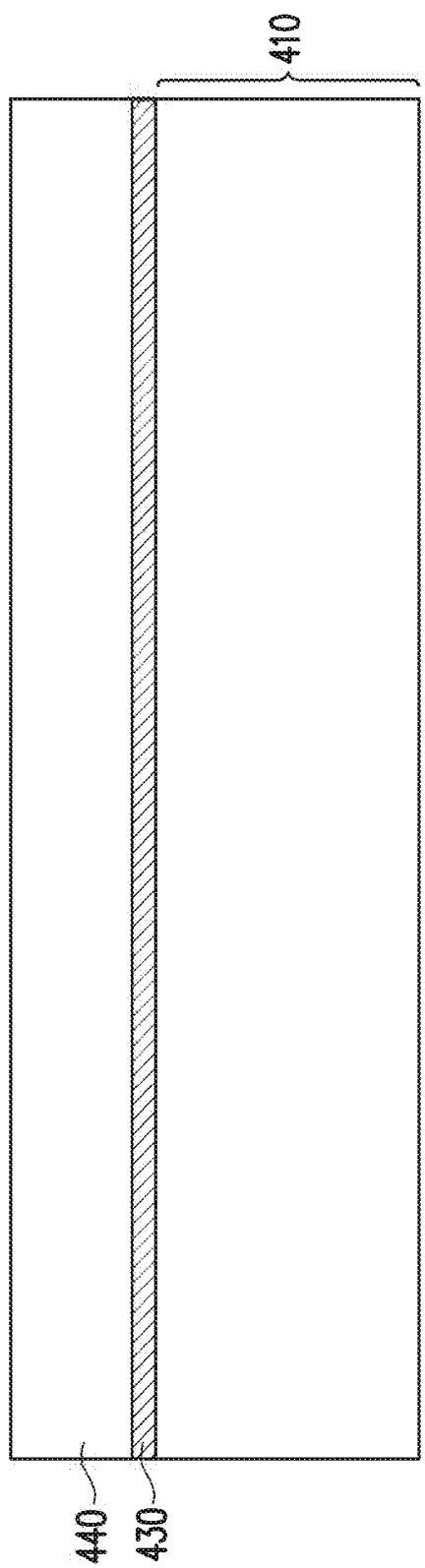
FIGS. 8-13 are illustrations of a thin film transistor device structure on a device layer at various stages of the thin film transistor device structure's fabrication process, according to some embodiments of the present disclosure.

In operation 710, a first oxide layer and a second oxide layer are formed on a device layer. Referring to FIG. 8, first oxide layer 430 and second oxide layer 440 are formed (e.g., deposited) on device layer 410.

Figure 9:
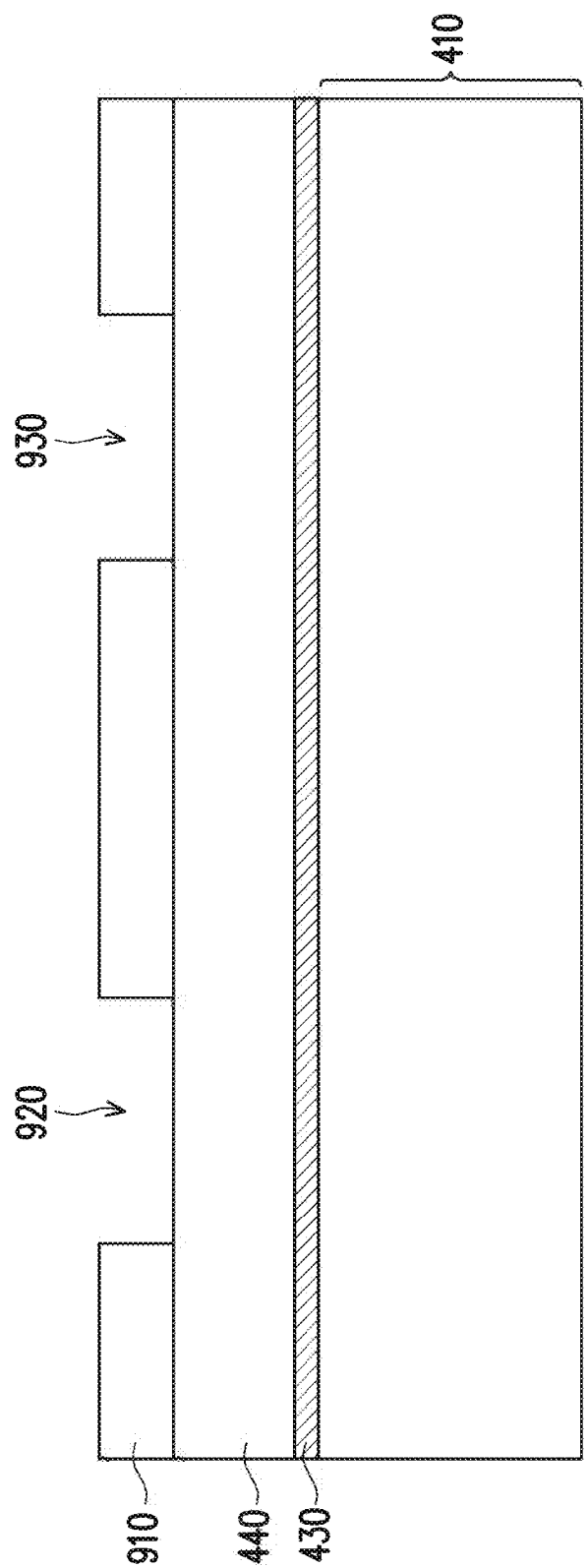

In operation 720, a first photoresist layer is formed on the second oxide layer and patterned to form openings. Referring to FIG. 9, a photoresist layer 910 is formed on second oxide layer 440 and patterned to form openings 920 and 930.

Figure 10:
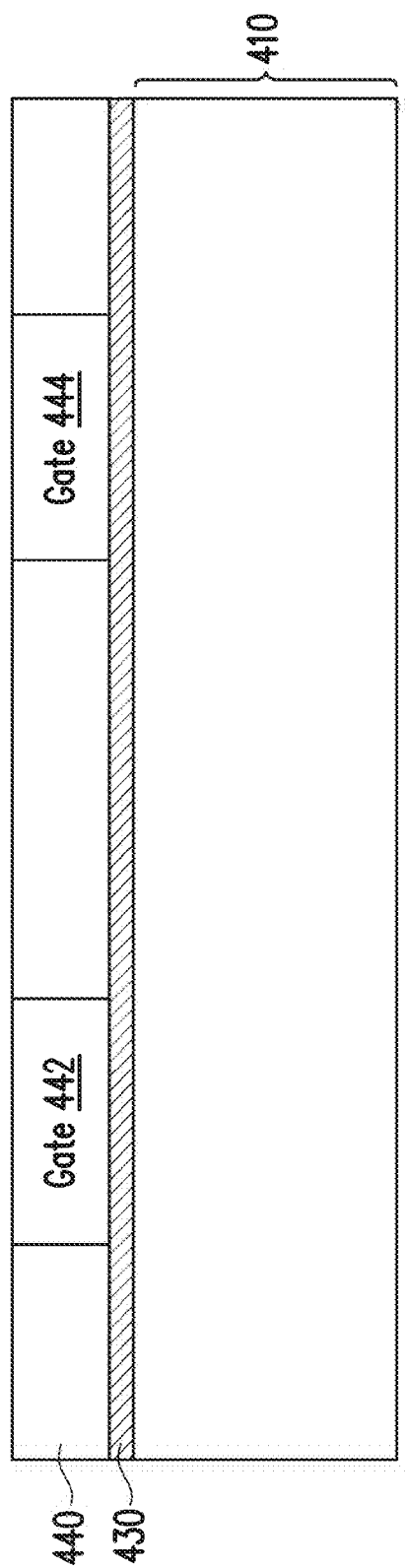

In operation 730, gate regions are formed. Referring to FIG. 10, after an etch process is performed in openings 920 and 930 and through second oxide layer 440, a gate material (e.g., a high-k dielectric material) is deposited. After photoresist layer 910 and excess material are polished away (e.g., via a chemical mechanical polishing process), gate regions 442 and 444 are formed.

Figure 11:
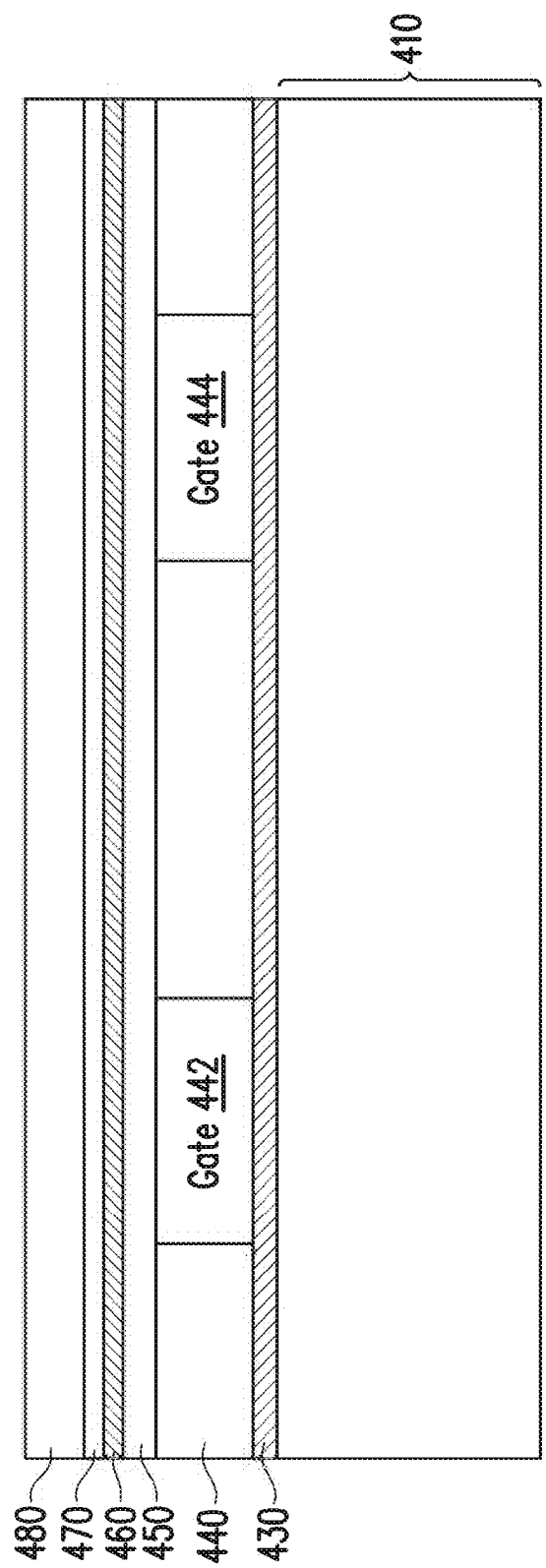

In operation 740, a gate oxide layer, a channel layer, a third oxide layer, and a fourth oxide layer are formed. Referring to FIG. 11, gate oxide layer 450, channel layer 460, third oxide layer 470, and fourth oxide layer 480 are formed (e.g., deposited) on the structure shown in FIG. 10.

Figure 12:
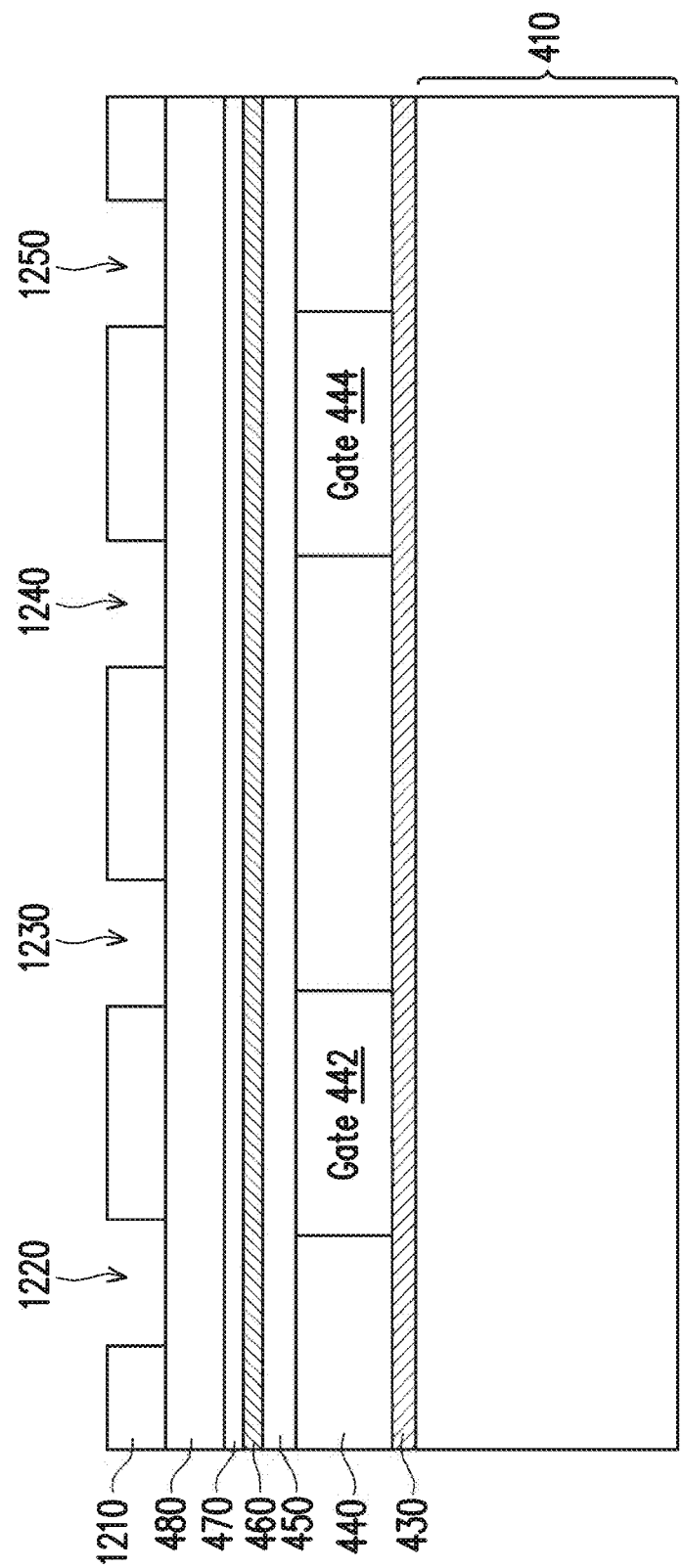

In operation 750, a second photoresist layer is formed on the fourth oxide layer and patterned to form openings. Referring to FIG. 12, a photoresist layer 1210 is formed on fourth oxide layer 480 and patterned to form openings 1220, 1230, 1240, and 1250.

Figure 13:
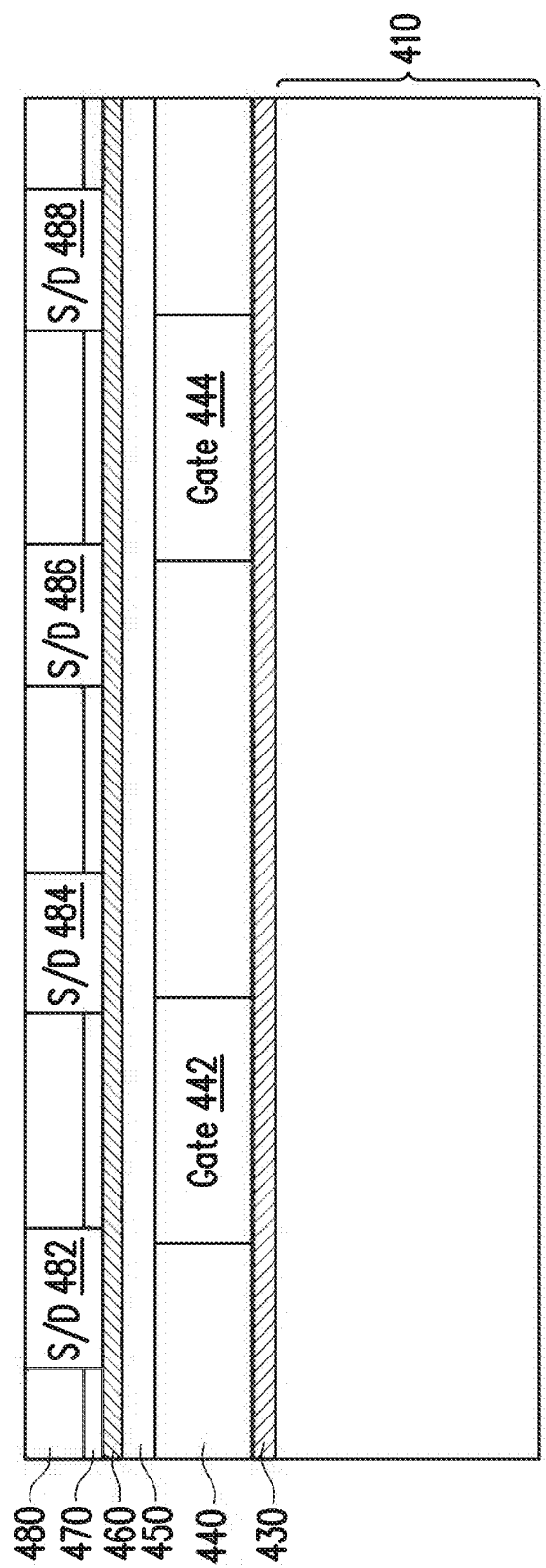

In operation 760, source/drain regions are formed. Referring to FIG. 13, after an etch process is performed in openings 1220, 1230, 1240, and 1250 and through third and fourth oxide layers 470 and 480, source/drain materials are deposited. After photoresist layer 1210 and excess material are polished away (e.g., via a chemical mechanical polishing process), source/drain regions 482, 484, 486, and 488 are formed.

In operation 770, a capping layer is formed over a first channel region of a first thin film transistor and an opening is formed over a second channel region of a second thin film transistor. Referring to FIG. 4, openings can be formed above a first portion of channel layer 460 (above gate region 442) and above a second portion of channel layer 460 (above gate region 444) by depositing a third photoresist layer (not shown) and performing an etch process. In the opening above the first portion of channel layer 460, capping material 485 can be deposited to block (or prevent) the channel region of thin film transistor 240 from receiving light, according to some embodiments of the present disclosure. In some embodiments of the present disclosure, the opening above the second portion of channel layer 460 remains open and acts as a light sensing area for thin film transistor 250.

In some embodiments of the present disclosure, referring to FIG. 4, interconnect structures can be formed on thin film transistor device layer 420 (not shown). The interconnect structures can be used to cover the middle portion of the channel region of thin film transistor 240 in place of capping material 485 (e.g., capping material 485 is not disposed over the middle portion of the channel region of thin film transistor 240), according to some embodiments of the present disclosure. Further, in some embodiments of the present disclosure, the interconnect structures can have an opening above light sensing area 487 so that thin film transistor 250 can be exposed to light (e.g., when a top cover of an integrated circuit chip package or a device casing is removed).

Embodiments of the present disclosure describe a thin film transistor based light sensor circuit. In some embodiments of the present disclosure, the thin film transistor based light sensor circuit includes two thin film transistors-one thin film transistor with a channel region having a light sensing area and another thin film transistor with a channel region having a capping material disposed thereon—and a comparator device. The comparator device can include two inputs: one input that is electrically coupled to a source/drain terminal of the thin film transistor with the channel region having the light sensing area and another input that is electrically coupled to a source/drain terminal of the thin film transistor with the channel region having the capping material disposed thereon. Based on a detection of light, the thin film transistor with the channel region having the light sensing area generates a current greater than that of the thin film transistor with the channel region having the capping material disposed thereon. As a result, an output of the comparator device can transition from a logic low value to a logic high value, or vice versa, indicating the detection of light by the thin film transistor based light sensor circuit. The output of the comparator device can be used to trigger an alarm or alert of a potential unauthorized access to an integrated circuit device. Benefits of the thin film transistor based light sensor circuit, among others, include a compact circuit design, low power consumption, and independence from temperature variations.

Embodiments of the present disclosure include a circuit with a first transistor, a second transistor, a capping material, and a comparator device. The first transistor includes a first channel region, a first source/drain region disposed on a first end portion of the first channel region, and a second source/drain region disposed on a second end portion of the first channel region, where the first channel region includes a light sensing area between the first and second end portions of the first channel region. The second transistor includes a second channel region, a third source/drain region disposed on a first end of the second channel region, a fourth source/drain region disposed on a second end of the second channel region, where the second channel region includes a middle portion between the first and second end portions of the second channel region. The capping material can be disposed over the middle portion of the second channel region. Further, the comparator device is electrically coupled to the first source/drain region of the first transistor and the third source/drain region of the second transistor and configured to detect a current difference between the first and second transistors in response to the first transistor being exposed to light.

Embodiments of the present disclosure include an integrated circuit device with a device layer and a thin film transistor device layer. The device layer includes a comparator device formed on a substrate and a first interconnect structure. The thin film transistor device layer is disposed on the device layer and includes a first thin film transistor, a second thin film transistor, a capping material, and a second interconnect structure. The first thin film transistor includes a first channel region, a first source/drain region disposed on a first end portion of the first channel region, and a second source/drain region disposed on a second end portion of the first channel region. The first channel region includes a light-receiving area between the first and second end portions of the first channel region. The second thin film transistor includes a second channel region, a third source/drain region disposed on a first end of the second channel region, a fourth source/drain region disposed on a second end of the second channel region. The second channel region includes a middle portion between the first and second end portions of the second channel region. The capping material is over the middle portion of the second channel region. Further, the second interconnect structure is arranged to electrically couple, via the first interconnect structure, the first and second thin film transistors to the comparator device.

Embodiments of the present disclosure include a method for operating a light sensor circuit. The method includes the following: receiving light via a light sensing area on a first channel region of a first thin film transistor, where the first thin film transistor is configured to generate a first current based on the received light; comparing the first current to a second current generated by a second thin film transistor, where the second thin film transistor includes a second channel region and a capping material, over the second channel region, to prevent receiving the light; and in response to the comparison indicating in a difference between the first and second currents, outputting an alarm signal.

It is to be appreciated that the Detailed Description section, and not the Abstract section, is intended to be used to interpret the claims. The Abstract section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first transistor with a first channel region, a first source/drain region disposed on a first end portion of the first channel region, and a second source/drain region disposed on a second end portion of the first channel region, wherein the first channel region comprises a light sensing area between the first and second end portions of the first channel region;
   a first capacitor directly coupled to the first source/drain region of the first transistor;
   a second transistor with a second channel region, a third source/drain region disposed on a first end of the second channel region, a fourth source/drain region disposed on a second end of the second channel region, wherein the second channel region comprises a middle portion between the first and second end portions of the second channel region;
   a second capacitor directly coupled to the third source/drain region of the second transistor;
   a capping material over the middle portion of the second channel region; and
   a comparator device electrically coupled to the first source/drain region of the first transistor and the third source/drain region of the second transistor and configured to detect a current difference between the first and second transistors in response to the first transistor being exposed to light.

2. The circuit of claim 1, wherein the first transistor comprises a first gate terminal and the second transistor comprises a second gate terminal, and wherein the first and second gate terminals are electrically coupled to a voltage source.

3. The circuit of claim 2, wherein the voltage source comprises a ground voltage source or a negative voltage source.

4. The circuit of claim 1, wherein the second source/drain region of the first transistor and the fourth source/drain region of the second transistor are electrically coupled to a voltage source.

5. The circuit of claim 4, wherein the voltage source comprises a ground voltage source or a positive voltage source.

6. The circuit of claim 1, wherein the first and second transistors are thin film transistors.

7. The circuit of claim 1, wherein the capping material comprises selenium or selenium oxide.

8. The circuit of claim 1, further comprising:
   a third transistor with a third channel region, a fifth source/drain region, and a sixth source/drain region; and
   a fourth transistor with a fourth channel region, a seventh source/drain region, and an eighth source/drain region, wherein:
   the sixth source/drain region of the third transistor is electrically coupled to the first source/drain region of the first transistor; and
   the eighth source/drain region of the fourth transistor is electrically coupled to the third source/drain region of the second transistor.

9. The circuit of claim 8, wherein:
   the first capacitor comprises first and second terminals, and wherein the first terminal is electrically coupled to the first and sixth source/drain regions of the first and third transistors, respectively, and wherein the second terminal is electrically coupled to a ground voltage source; and
   the second capacitor comprises third and fourth terminals, and wherein the third terminal is electrically coupled to the third and eighth source/drain regions of the second and fourth transistors, respectively, and wherein the fourth terminal is electrically coupled to the ground voltage source.

10. The circuit of claim 9, wherein the first, second, third, and fourth transistors comprise first, second, third, and fourth gate terminals, respectively, wherein:
    the first and second gate terminals are electrically coupled to a ground voltage source or a negative voltage source, and
    the third gate terminal, fourth gate terminal, the fifth source/drain region of the third transistor, and seventh source/drain region of the fourth transistor are electrically coupled to a positive voltage source.

11. The circuit of claim 8, wherein the first and second transistors are thin film transistors, and wherein the third and fourth transistors are p-channel complementary metal oxide semiconductor transistors.

12. An integrated circuit structure, comprising:
    a device layer, comprising
       a comparator device formed on a substrate; and
    a thin film transistor device layer disposed on the device layer, wherein the thin film transistor device layer comprises:
       a first thin film transistor that comprises a first channel region, a first source/drain region disposed on a first end portion of the first channel region, and a second source/drain region disposed on a second end portion of the first channel region, and wherein the first channel region comprises a light-receiving area between the first and second end portions of the first channel region;
       a first capacitor directly coupled to the first source/drain region of the first thin film transistor;

a second thin film transistor that comprises a second channel region, a third source/drain region disposed on a first end of the second channel region, a fourth source/drain region disposed on a second end of the second channel region, and wherein the second channel region comprises a middle portion between the first and second end portions of the second channel region;

a second capacitor directly coupled to the third source/drain region of the second thin film transistor;

a capping material over the middle portion of the second channel region; and an interconnect structure arranged to electrically couple the first and second thin film transistors to the comparator device.

13. The integrated circuit structure of claim 12, wherein the first thin film transistor comprises a first gate terminal and the second thin film transistor comprises a second gate terminal, and wherein the first and second gate terminals are electrically coupled to a ground voltage source or a negative voltage source.

14. The integrated circuit structure of claim 12, wherein the capping material comprises selenium or selenium oxide.

15. The integrated circuit structure of claim 12, wherein the device layer further comprises:

a first p-channel complementary metal oxide semiconductor transistor with a third channel region, a fifth source/drain region, and a sixth source/drain region; and a second p-channel complementary metal oxide semiconductor transistor with a fourth channel region, a seventh source/drain region, and an eighth source/drain region, wherein:

the sixth source/drain region of the first p-channel complementary metal oxide semiconductor transistor is electrically coupled to the first source/drain region of the first thin film transistor; and the eighth source/drain region of the second p-channel complementary metal oxide semiconductor transistor is electrically coupled to the third source/drain region of the second thin film transistor; wherein:

the first capacitor comprises first and second terminals, wherein the first terminal is electrically coupled to the first and sixth source/drain regions of the first thin film transistor and first p-channel complementary metal oxide semiconductor transistor, respectively, and wherein the second terminal is electrically coupled to a ground voltage source; and the second capacitor comprises third and fourth terminals, wherein the third terminal is electrically coupled to the third and eighth source/drain regions of the second thin film transistor and second p-channel complementary metal oxide semiconductor transistor, respectively, and wherein the fourth terminal is electrically coupled to the ground voltage source.

16. The integrated circuit structure of claim 15, wherein the fifth source/drain region of the first p-channel complementary metal oxide semiconductor transistor and the seventh source/drain region of the second p-channel complementary metal oxide semiconductor transistor are electrically coupled to a positive voltage source.

17. A circuit, comprising:

a first transistor comprising a first channel region with a light sensing area;

a first capacitor directly coupled to the first transistor;

a second transistor with a second channel region;

a second capacitor directly coupled to the second transistor;

a capping material over the second channel region; and a comparator device electrically coupled to the first and second transistors and configured to detect a current difference between the first and second transistors in response to the first transistor being exposed to light.

18. The circuit of claim 17, wherein the first transistor comprises a first gate terminal and the second transistor comprises a second gate terminal, and wherein the first and second gate terminals are electrically coupled to a voltage source.

19. The circuit of claim 18, wherein the voltage source comprises a ground voltage source or a negative voltage source.

20. The circuit of claim 17, wherein the capping material comprises selenium or selenium oxide.

* * * * *